United States Patent
Kamand et al.

(10) Patent No.: US 10,739,813 B1
(45) Date of Patent: Aug. 11, 2020

(54) GLITCH FREE CLOCK SWITCHING CIRCUIT

(71) Applicant: GOODIX TECHNOLOGY INC., San Diego, CA (US)

(72) Inventors: Bassam S. Kamand, San Diego, CA (US); Ramon Zuniga, San Diego, CA (US); Perry Virjee, San Diego, CA (US)

(73) Assignee: GOODIX TECHNOLOGY INC., San Diego ( * ) Notice: Subject to any disclaimer, the term of this patent is extended or adjusted under 35 U.S.C. 154(b) by 0 days.

(21) Appl. No.: 16/817,612

(22) Filed: Mar. 13, 2020

(51) Int. Cl.
  *G06F 1/12* (2006.01)
  *H03L 7/089* (2006.01)
  *G06F 1/10* (2006.01)

(52) U.S. Cl.
  CPC .................. *G06F 1/12* (2013.01); *G06F 1/10* (2013.01); *H03L 7/0893* (2013.01)

(58) Field of Classification Search
  None
  See application file for complete search history.

(56) References Cited

U.S. PATENT DOCUMENTS

| | | | |
|---|---|---|---|
| 6,222,392 B1* | 4/2001 | Guo | H04J 3/0688 327/198 |
| 9,612,611 B1* | 4/2017 | Nakibly | G06F 1/04 |
| 10,530,375 B1* | 1/2020 | Wang | H03L 7/1976 |
| 2015/0222283 A1* | 8/2015 | Wanibuchi | G06F 1/08 327/115 |
| 2019/0288694 A1* | 9/2019 | Parekh | H03L 7/07 |
| 2019/0339651 A1* | 11/2019 | Yao | H03L 7/197 |

* cited by examiner

*Primary Examiner* — Lincoln D Donovan
*Assistant Examiner* — Khareem E Almo
(74) *Attorney, Agent, or Firm* — Kilpatrick Townsend & Stockton LLP

(57) ABSTRACT

A clock generation circuit is disclosed. The clock generation circuit includes a logic gate configured to, in response to a control input receiving a first control signal, generate an output clock based on a first input clock received by a first identified clock input. The logic gate is further configured to, in response to the control input receiving the second control signal, generate the output clock based on a fixed logic level. The logic gate is further configured to, in response to the control input receiving the second control signal, generate the output clock based on the second input clock.

20 Claims, 2 Drawing Sheets

GLITCH FREE CLOCK SWITCHING CIRCUIT

FIELD OF THE INVENTION

The present application generally pertains to clock generation circuits, and more particularly to clock generation circuits which have programmable output clock frequencies.

BACKGROUND OF THE INVENTION

Clock generation circuits may be programmable, such that the frequency of an output clock they generate may be programmable. When switching from an output clock of a first frequency to an output clock of the second frequency, glitches or short pulses may be generated. Low area and low power clock generation circuits configured to change the frequency of the output clock are needed in the art.

BRIEF SUMMARY OF THE INVENTION

One inventive aspect is a clock generation circuit. The clock generation circuit includes a plurality of clock inputs, each configured to receive one of a plurality of input clocks, a control input configured to receive a first control signal identifying a first of the clock inputs followed by a second control signal identifying a second of the clock inputs, and a logic gate configured to, in response to the control input receiving the first control signal, generate an output clock based on a first input clock received by the first identified clock input. The logic gate is further configured to, in response to the control input receiving the second control signal, while the output clock has a particular logic state, commence generating the output clock based on a fixed logic level such that the output clock maintains the particular logic state. The logic gate is further configured to, in response to the control input receiving the second control signal, while the output clock maintains the particular logic state and while a second input clock received by the second identified clock input has the particular logic state, commence generating the output clock based on the second input clock. During a time period starting with a start time while the output clock is generated based on the first input clock and ending with an end time while the output clock is generated based on the second input clock, all high times of the output clock have durations which are substantially equal to or greater than the lesser of high times of the first input clock and high times of the second input clock, and all low times of the output clock have durations which are substantially equal to or greater than the lesser of low times of the first input clock and low times of the second input clock.

Another inventive aspect is a method of using a clock generation circuit. The method includes: with a plurality of clock inputs, receiving a plurality of input clocks, with a control input, receiving a first control signal identifying a first of the clock inputs, with the control input, after receiving the first control signal, receiving a second control signal identifying a second of the clock inputs, with a logic gate, in response to the control input receiving the first control signal, generating an output clock based on a first input clock received by the first identified clock input, with the logic gate, in response to the control input receiving the second control signal, while the output clock has a particular logic state, commencing generation of the output clock based on a fixed logic level such that the output clock maintains the particular logic state, and with the logic gate, in response to the control input receiving the second control signal, while the output clock maintains the particular logic state and while a second input clock received by the second identified clock input has the particular logic state, commencing generation of the output clock based on the second input clock. During a time period starting with a start time while the output clock is generated based on the first input clock and ending with an end time while the output clock is generated based on the second input clock, all high times of the output clock have durations which are substantially equal to or greater than the lesser of high times of the first input clock and high times of the second input clock, and all low times of the output clock have durations which are substantially equal to or greater than the lesser of low times of the first input clock and low times of the second input clock.

DETAILED DESCRIPTION OF THE INVENTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

Figure 1:
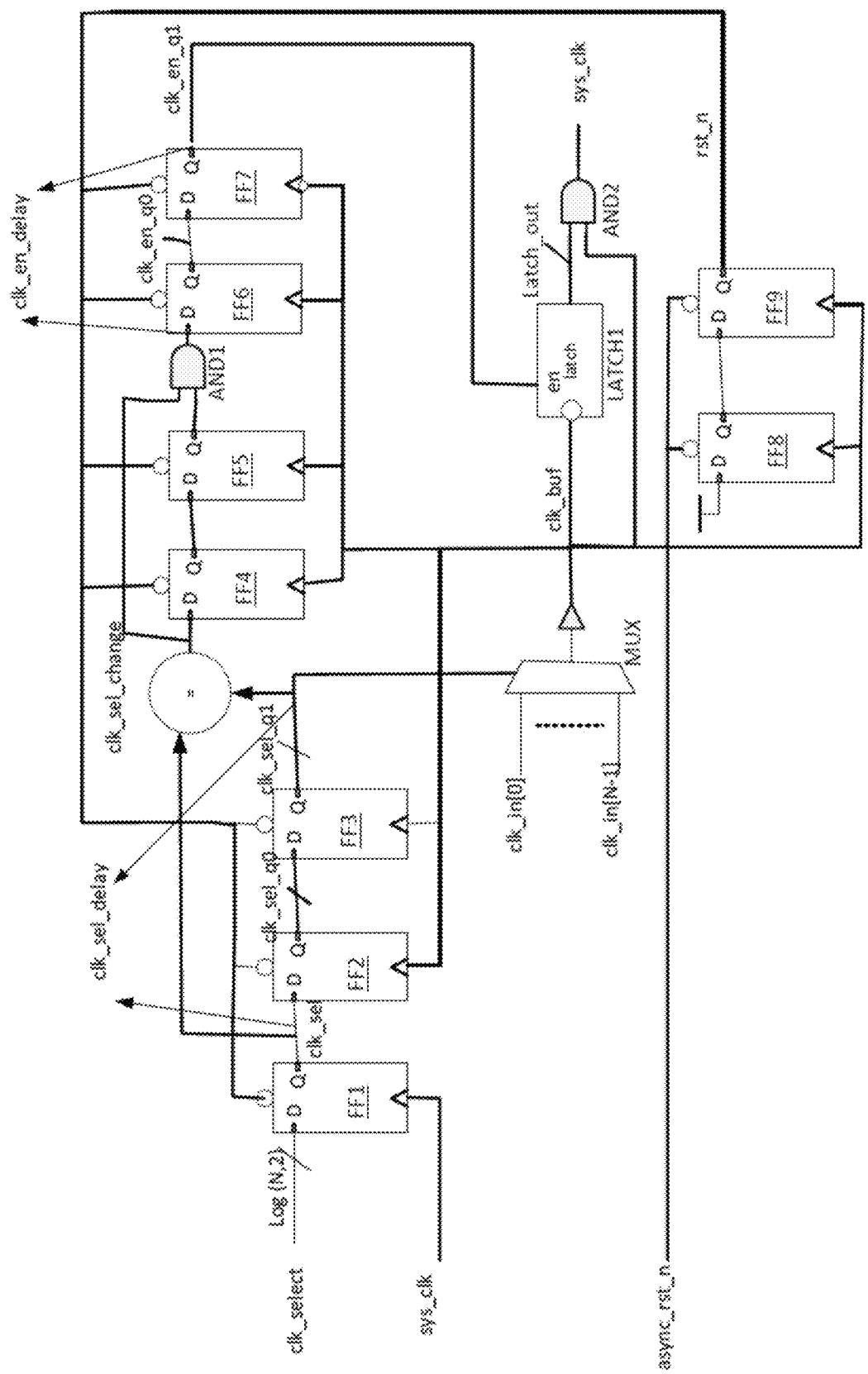
FIG. 1 is a schematic diagram of a clock generation circuit.

FIG. 1 is a schematic diagram of a clock generation circuit 100.

Clock generation circuit 100 includes first flip-flop FF 1, second flip-flop FF 2, third flip-flop FF 3, comparator COMP, for flip-flop FF 4, fifth flip-flop FF 5, first AND gate AND 1, sixth flip-flop FF 6, seventh flip-flop FF 7, multiplexer MUX, latch 1, second AND gate AND 2, eight flip-flop FF 8, and ninth flip-flop FF 9.

Clock generation circuit 100 produces an output clock at output node sys_clk. The output clock is a gated version of one of the N input clocks received at input nodes (clk_in[0]-clk_in[N−1]). Accordingly the output clock has a frequency which is identical or substantially identical to a frequency of one of the N input clocks. Which of the N input clocks is used to generate the output clock is determined by a control signal received at input bus clk_select.

While operating using a first of the N input clocks to generate the output clock, clock generation circuit 100 is configured to change modes so as to generate the output clock based on another of the N input clocks. The change occurs in response to a change in the control signal received at input bus clk_select, where the value at input bus clk_select is changed from a first control signal corresponding with a first input clock having a first frequency to a second control signal corresponding with a second input clock having a second frequency.

Clock generation circuit 100 is configured to make the change in modes such that the output clock does not glitch. Accordingly, the change in mode occurs such that when switching from a first higher frequency input clock to a second lower frequency input clock all high times and low times of the output clock have durations which are substantially equal to or greater than the corresponding high times and low times of the higher frequency input clock. Similarly, the change in mode occurs such that when switching from a first lower frequency to a second higher frequency input clock all high times and low times of the output clock have durations which are substantially equal to or greater than the corresponding high times and low times of the higher frequency input clock.

To accomplish this, in response to the change in the control signal received at input bus clk_select, during a time when the output clock is low, the source of the output clock is switched from the first input clock to a low signal. Subsequently, during a time when the output clock is still low and the second input clock is also low, the source of the output clock is switched from the low signal to the second input clock.

In alternative embodiments, during a time when the output clock is high, the source of the output clock is switched from the first input clock to a high signal. Subsequently, during a time when the output clock is still high and the second input clock is also high, the source of the output clock is switched from the low signal to the second input clock.

The first flip-flop FF 1 stores the received second control signal at its Q output in response to rising edges of the output clock. The stored second control signal at the Q output of the first flip-flop FF 1 is provided to the comparator COMP and to a D input of the second flip-flop FF 2.

The second flip-flop FF 2 stores the stored second control signal from the Q output of the first flip-flop FF 1 at the Q output of the second flip-flop FF 2 in response to rising edges of an intermediate clock at node clk_buf. The stored second control signal at the Q output of the second flip-flop FF 2 is provided to a D input of the third flip-flop FF 3.

The third flip-flop FF 3 stores the stored second control signal from the Q output of the second flip-flop FF 2 at the Q output of the third flip-flop FF 3 in response to rising edges of an intermediate clock at node clk_buf. The stored second control signal at the Q output of the third flip-flop FF 3 is provided to the comparator COMP and to the multiplexer MUX.

The multiplexer MUX receives the stored second control signal from the output of the third flip-flop FF 3, and changes the source of the intermediate clock from the first input clock corresponding with the first control signal to the second input clock corresponding with the second control signal.

The comparator COMP compares the value of the stored control signal at the Q output of the first flip-flop FF 1 to the value of the stored control signal at the Q output of the third flip-flop FF 3. If the values of the compared control signals are the same, the comparator COMP generates a high output. If the values of the compared control signals are not the same, the comparator COMP generates a low output. The output of the comparator COMP is provided to a first input of first AND gate AND 1, and to fourth flip-flop FF 4.

The fourth flip-flop FF 4 stores the received comparator output from comparator COMP at the Q output of the fourth flip-flop FF 4 in response to rising edges of the intermediate clock at node clk_buf. The stored comparator output at the Q output of the fourth flip-flop FF 4 is provided to a D input of the fifth flip-flop FF 5.

The fifth flip-flop FF 5 stores the received comparator output from the Q output of the fourth flip-flop FF 4 at the Q output of the fifth flip-flop FF 5 in response to rising edges of the intermediate clock at node clk_buf. The stored comparator output at the Q output of the fifth flip-flop FF 5 is provided to a second input of the first AND gate AND 1.

First AND gate AND 1 receives the output of the comparator COMP at its first input, and receives the stored comparator output from the Q output of the fifth flip-flop FF 5 at its second input. First AND gate AND 1 generates an output equal to the logical AND of the signals received at its first and second inputs. The output of first AND gate AND 1 is provided to the D input of sixth flip-flop FF 6.

The sixth flip-flop FF 6 stores the received output of first AND gate AND 1 at the Q output of the sixth flip-flop FF 6 in response to rising edges of the intermediate clock at node clk_buf. The stored output of the first AND gate AND 1 at the Q output of the sixth flip-flop FF 6 is provided to the D input of seventh flip-flop FF 7.

The seventh flip-flop FF 7 stores the output of first AND gate AND 1 received from the Q output of the sixth flip-flop FF 6 at the Q output of the seventh flip-flop FF 7 in response to falling edges of the intermediate clock at node clk_buf. The stored output of the first AND gate AND 1 at the Q output of the seventh flip-flop FF 7 is provided to a data input of a latch LATCH 1.

Latch LATCH 1 latches the signal received at its data input to its output in response to low times of the intermediate clock. The latch signal at the output of latch LATCH 1 is provided to a first input of second AND gate AND 2 as a mode state signal.

Second AND gate AND 2 receives the mode state signal at its first input, and receives the intermediate clock at a second input. Second AND gate AND 2 generates an output equal to the logical AND of the signals received at its first and second inputs. The output of second AND gate AND 2 is the output clock of clock generation circuit 100.

Eighth flip-flop FF 8 and ninth flip-flop FF 9 receive an reset input signal at input node async_rst_n. While the reset input signal is high, eighth flip-flop FF 8 and ninth flip-flop FF 9 synchronously generate a high reset signal according to the intermediate clock. In response to the input reset input signal going low, ninth flip-flop FF 9 generates a low reset signal. In response to receiving the high reset signal, first through seventh flip-flops FF 1-7 operate as discussed above. In response to receiving the low reset signal, first through seventh flip-flops FF 1-7 are reset.

Figure 2:
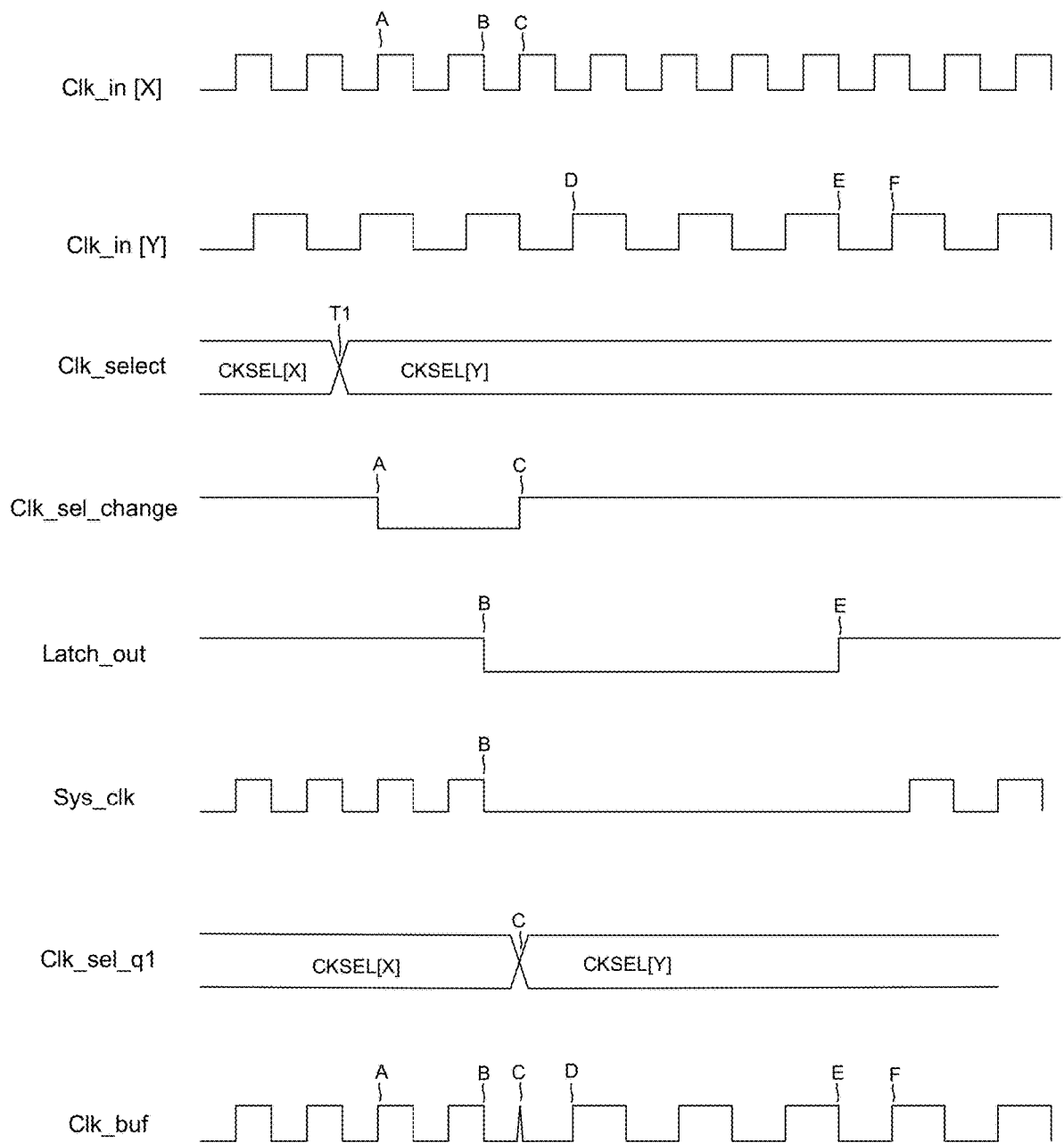
FIG. 2 is a waveform diagram illustrating wave forms representing various signals during the operation of the clock generation circuit of FIG. 1.

FIG. 2 is a waveform diagram illustrating wave forms representing various signals during the operation of clock generation circuit 100 of FIG. 1.

Clk_in[X] illustrates a waveform representing a first input clock of the N input clocks received at input nodes (clk_in[0]-clk_in[N−1]).

Clk_in[Y] illustrates a waveform representing a second input clock of the N input clocks received at input nodes (clk_in[0]-clk_in[N−1]).

Clk_select illustrates a waveform representing the control signal received at input bus clk_select. As shown, the control signal is changed from a first control signal CKSEL[X] corresponding with the first input clock to a second control signal CKSEL[Y] corresponding with the second input clock.

Clk_sel_change illustrates a waveform representing the output of the comparator COMP at node clk_sel_change.

Clk_en_q1 illustrates a waveform representing the output of latch LATCH 1.

Sys_clk illustrates a waveform representing the output clock of clock generation circuit 100.

Clk_sel_q1 illustrates a waveform representing the control input to multiplexer MUX. As shown, the control signal is changed from a first control signal CKSEL[X] corresponding with the first input clock to a second control signal CKSEL[Y] corresponding with the second input clock.

Clk_buf illustrates a waveform representing the intermediate clock at node clk_buf.

As shown, at time T1, the control signal illustrated with Clk_select is changed from a first control signal CKSEL[X] corresponding with the first input clock to a second control signal CKSEL[Y] corresponding with the second input clock.

In response to the next rising edge of the intermediate clock, at time A, first flip-flop FF 1 stores the received second control signal at its Q output. In response to the second control signal at the Q output of first flip-flop FF 1 being different from the first control signal at the Q output of third flip-flop FF 3, at time A, the output of comparator COMP illustrated with Clk_sel_change, goes low.

In response to the output of comparator COMP going low, and to the next falling edge of the immediate clock following the next rising edge of the intermediate clock, at time B, the output of latch LATCH 1 goes low.

Prior to the output of latch LATCH 1 going low at time B, the output clock illustrated with Sys_clk, is a gated version of the input clock illustrated with Clk_in[X]. Once output of latch LATCH 1 goes low at time B, the output clock is held low by second AND gate AND 2.

At the next rising edge of the intermediate clock, at time C, third flip-flop FF 3 stores the second control signal at its Q output. In response to the second control signal at the Q output of third flip-flop FF 3 being the same as the second control signal at the Q output of first flip-flop FF 1, at time C, the output of comparator COMP illustrated with Clk_sel_change, goes high.

In addition, at time C, in response to third flip-flop FF 3 storing the second control signal at its Q output, the multiplexer MUX causes the source of the intermediate clock to change from the first input clock, illustrated with Clk_in[X], to the second input illustrated with clock Clk_in[Y]. As illustrated, at the change, the intermediate clock experiences a glitch because at the change, the first input clock had just transitioned high (or was still transitioning high), and the second input clock was low. This is an example of a glitch which clock generation circuit 100 prevents in the output clock as it switches from a first frequency to a second frequency.

Because the input clock source of the intermediate clock changes from the first input clock to the second input clock at time C, the next rising edge of the intermediate clock, at time D, is caused by the rising edge of the second input clock occurring at time D.

The rising edge of the intermediate clock occurring at time D causes the high output of comparator COMP indicating that the second control signal at the Q output of third flip-flop FF 3 is the same as the second control signal at the Q output of first flip-flop FF 1, to be stored at the Q output of fourth flip-flop FF 4.

The next rising edge of the intermediate clock occurring after the rising edge at time D causes the high output of comparator COMP to be stored at the Q output of fifth flip-flop FF 5.

The second rising edge of the intermediate clock occurring after the rising edge at time D causes the high output of comparator COMP to be stored at the Q output of sixth flip-flop FF 6.

At time E, the next falling edge of the intermediate clock occurring after the second rising edge of the intermediate clock after time D the high output of comparator COMP to be stored at the Q output of seventh flip-flop FF 7.

The Q output of seventh flip-flop FF 7 going high, at time E, causes the second AND gate AND 2 to pass the intermediate clock as the output clock instead of holding the output clock low. Because the intermediate clock is low at time E, the change in the output clock to being sourced by the intermediate clock does not cause a glitch in the output clock.

At time F, the output clock rises in response to the intermediate clock rising at time F, where the intermediate clock rises at time F in response to the second input clock illustrated with Clk_in[Y] rising at time F. As illustrated, after time F, the output clock corresponds with the second input clock.

As understood by those of skill in the art, the times A, B, C, D, E, and F discussed herein are not instantaneous moments, but instead refer to time periods during which the indicated actions referenced as taking place occur.

Sequenced flip-flop pairs respectively comprising the second and third flip-flops FF 2 and FF 3, fourth and fifth flip-flops FF 4 and FF 5, and sixth and seventh flip-flops FF 6 and FF 7, occur as pairs instead of single flip-flops at least so that glitches in the intermediate clock do not cause errors in operation. Accordingly, the output clock may transition from a first frequency to a second frequency without glitches regardless of whether or not glitches occur in the intermediate clock as a result of the intermediate clock transitioning from the first frequency to the second frequency.

Though the present invention is disclosed by way of specific embodiments as described above, those embodiments are not intended to limit the present invention. Based on the methods and the technical aspects disclosed herein, variations and changes may be made to the presented embodiments by those of skill in the art without departing from the spirit and the scope of the present invention.

What is claimed is:

1. A clock generation circuit, comprising:
   a plurality of clock inputs, each configured to receive one of a plurality of input clocks;
   a control input configured to receive a first control signal identifying a first of the clock inputs followed by a second control signal identifying a second of the clock inputs; and
   a logic gate configured to, in response to the control input receiving the first control signal, generate an output clock based on a first input clock received by the first identified clock input,
   wherein the logic gate is further configured to, in response to the control input receiving the second control signal, while the output clock has a particular logic state, commence generating the output clock based on a fixed logic level such that the output clock maintains the particular logic state,
   wherein the logic gate is further configured to, in response to the control input receiving the second control signal, while the output clock maintains the particular logic state and while a second input clock received by the second identified clock input has the particular logic state, commence generating the output clock based on the second input clock, and
   wherein, during a time period starting with a start time while the output clock is generated based on the first input clock and ending with an end time while the output clock is generated based on the second input clock:
   all high times of the output clock have durations which are substantially equal to or greater than the lesser of high times of the first input clock and high times of the second input clock, and all low times of the output clock have durations which are substantially equal to or greater than the lesser of low times of the first input clock and low times of the second input clock.

2. The clock generation circuit of claim 1, further comprising a multiplexer circuit, wherein the multiplexer circuit comprises:

a plurality of input terminals, each configured to receive one of the input clocks;

a control input port, configured to receive the first and second control signals; and an output terminal, wherein the multiplexer circuit is configured to generate a first intermediate clock at the output terminal in response to the control input port receiving the first control signal, wherein the first intermediate clock is substantially identical to the first input clock received at a first particular one of the input terminals identified by the first control signal, and wherein the multiplexer circuit is configured to generate a second intermediate clock at the output terminal in response to the control input port receiving the second control signal, wherein the second intermediate clock is substantially identical to the second input clock received at a second particular one of the input terminals identified by the second control signal.

3. The clock generation circuit of claim 2, wherein the logic gate is configured to receive the first intermediate clock and the second intermediate clock at a first logic gate input, and to generate the output clock based on the received first intermediate clock and the received second intermediate clock.

4. The clock generation circuit of claim 3, wherein the logic gate is further configured to receive a mode state signal, wherein the mode state signal having a first logic level causes the logic gate to generate the output clock as having a fixed logic level, and wherein the mode state signal having a second logic level causes the logic gate to generate the output clock as a gated version of the intermediate clock received at its first logic gate input.

5. The clock generation circuit of claim 4, wherein the mode state signal is caused to have the first logic level in response to a transition from the control input receiving the first control signal to the control input receiving the second control signal.

6. The clock generation circuit of claim 5, wherein the mode state signal is caused to have the first logic level after a particular duration starting with the transition from the control input receiving the first control signal to the control input receiving the second control signal.

7. The clock generation circuit of claim 6, wherein the particular duration is based at least in part on a period of the first input clock.

8. The clock generation circuit of claim 4, wherein the mode state signal is caused to have the second logic level in response to either of:

the control input receiving the first control signal for at least a first duration; and the control input receiving the second control signal for at least for a second duration.

9. The clock generation circuit of claim 8, wherein the first duration is different from the second duration.

10. The clock generation circuit of claim 8, wherein the second duration is based partly on a period of the second input clock.

11. A method of using a clock generation circuit, the method comprising:

with a plurality of clock inputs, receiving a plurality of input clocks;

with a control input, receiving a first control signal identifying a first of the clock inputs;

with the control input, after receiving the first control signal, receiving a second control signal identifying a second of the clock inputs;

with a logic gate, in response to the control input receiving the first control signal, generating an output clock based on a first input clock received by the first identified clock input;

with the logic gate, in response to the control input receiving the second control signal, while the output clock has a particular logic state, commencing generation of the output clock based on a fixed logic level such that the output clock maintains the particular logic state; and with the logic gate, in response to the control input receiving the second control signal, while the output clock maintains the particular logic state and while a second input clock received by the second identified clock input has the particular logic state, commencing generation of the output clock based on the second input clock, wherein, during a time period starting with a start time while the output clock is generated based on the first input clock and ending with an end time while the output clock is generated based on the second input clock:

all high times of the output clock have durations which are substantially equal to or greater than the lesser of high times of the first input clock and high times of the second input clock, and all low times of the output clock have durations which are substantially equal to or greater than the lesser of low times of the first input clock and low times of the second input clock.

12. The method of claim 11, further comprising:

with a multiplexer circuit comprising:

a plurality of input terminals, each configured to receive one of the input clocks, a control input port, configured to receive the first and second control signals, and an output terminal, generating a first intermediate clock at the output terminal in response to the control input port receiving the first control signal, wherein the first intermediate clock is substantially identical to the first input clock received at a first particular one of the input terminals identified by the first control signal; and generating a second intermediate clock at the output terminal in response to the control input port receiving the second control signal, wherein the second intermediate clock is substantially identical to the second input clock received at a second particular one of the input terminals identified by the second control signal.

13. The method of claim 12, further comprising:

with the logic gate, receiving the first intermediate clock and the second intermediate clock at a first logic gate input; and generating the output clock based on the received first intermediate clock and the received second intermediate clock.

14. The method of claim 13, further comprising:
with the logic gate, receiving a mode state signal, wherein the mode state signal having a first logic level causes the logic gate to generate the output clock as having a fixed logic level, and wherein the mode state signal having a second logic level causes the logic gate to generate the output clock as a gated version of the intermediate clock received at its first logic gate input.

15. The method of claim 14, wherein the mode state signal is caused to have the first logic level in response to a transition from the control input receiving the first control signal to the control input receiving the second control signal.

16. The method of claim 15, wherein the mode state signal is caused to have the first logic level after a particular duration starting with the transition from the control input receiving the first control signal to the control input receiving the second control signal.

17. The method of claim 16, wherein the particular duration is based at least in part on a period of the first input clock.

18. The method of claim 14, wherein the mode state signal is caused to have the second logic level in response to either of:
the control input receiving the first control signal for at least a first duration; and
the control input receiving the second control signal for at least for a second duration.

19. The method of claim 18, wherein the first duration is different from the second duration.

20. The method of claim 18, wherein the second duration is based partly on a period of the second input clock.

\* \* \* \* \*